(12) United States Patent
Kullick et al.

(10) Patent No.: US 9,891,262 B2
(45) Date of Patent: Feb. 13, 2018

(54) APPARATUS FOR INSULATING MONITORING

(71) Applicants: HELLA KGaA Hueck & Co., Lippstadt (DE); BENDER GMBH & CO. KG, Grünberg (DE)

(72) Inventors: Sven Kullick, Lippstadt (DE); Mario Lehr, Grünberg-Reinhardshain (DE); Hans-Jürgen Jäger, Alsfeld (DE); Carsten Weiβ, Laubach (DE)

(73) Assignees: HELLA GMBH & CO. KGAA, Lippstadt (DE); BENDER GMBH & CO. KG, Grünberg (DE)

( * ) Notice: Subject to any disclaimer, the term of this patent is extended or adjusted under 35 U.S.C. 154(b) by 0 days.

(21) Appl. No.: 14/574,431

(22) Filed: Dec. 18, 2014

(65) Prior Publication Data

US 2015/0177308 A1  Jun. 25, 2015

(30) Foreign Application Priority Data

Dec. 19, 2013  (DE) .................. 10 2013 226 595

(51) Int. Cl.
*G01R 31/12* (2006.01)
*G01R 31/14* (2006.01)
(Continued)

(52) U.S. Cl.
CPC ........ *G01R 31/1245* (2013.01); *B60L 3/0069* (2013.01); *G01R 31/006* (2013.01); *G01R 31/025* (2013.01); *G01R 31/3277* (2013.01)

(58) Field of Classification Search
CPC ...... G01R 31/025; G01R 31/12; G01R 31/14; G01R 31/18; G01R 31/28; G01R 31/3658
(Continued)

(56) References Cited

U.S. PATENT DOCUMENTS 5,760,587 A    6/1998  Harvey
2003/0214306 A1*  11/2003  Beutelschiess ........... B60L 3/00
                                                  324/511

(Continued)

FOREIGN PATENT DOCUMENTS

DE    40 37 860 C1    4/1992
DE    102 12 493 A1   10/2003
(Continued)

OTHER PUBLICATIONS

European Search Report, Appl. No. 14199034.1, dated Sep. 25, 2015, 13 pgs.

(Continued)

*Primary Examiner* — Arleen M Vazquez
*Assistant Examiner* — Neel Shah
(74) *Attorney, Agent, or Firm* — Paul D. Strain, Esq.; Strain & Strain PLLC

(57) ABSTRACT

The invention relates to an apparatus for insulation monitoring between a low-voltage supply system and a high-voltage supply system, wherein the apparatus can be connected both to a high-voltage positive connection and also to a high-voltage negative connection and also to the low-voltage supply system, wherein the apparatus has a plurality of electrical contacts for coupling monitoring connections to the high-voltage circuit by means of a respective high-voltage positive connection and by means of a respective high-voltage negative connection, it being possible for said contacts to be connected in different sections of the high-voltage supply system.

12 Claims, 1 Drawing Sheet

(51) Int. Cl.
*G01R 31/28* (2006.01)
*G01R 31/36* (2006.01)
*G01R 31/00* (2006.01)
*G01R 31/02* (2006.01)
*B60L 3/00* (2006.01)
*G01R 31/327* (2006.01)

(58) Field of Classification Search
USPC .............. 324/503, 509, 551, 525, 541, 426
See application file for complete search history.

(56) References Cited

U.S. PATENT DOCUMENTS

| | | |
|---|---|---|
| 2004/0130288 A1 | 7/2004 | Souther et al. |
| 2005/0012506 A1* | 1/2005 | Yudahira ............... B60L 3/0023 324/511 |
| 2007/0176604 A1* | 8/2007 | Morimoto ............ B60L 3/0023 324/525 |
| 2011/0206952 A1* | 8/2011 | Mano .................... H01M 10/48 429/50 |
| 2012/0280695 A1* | 11/2012 | Sekizaki ............. B60L 11/1855 324/434 |
| 2013/0106437 A1* | 5/2013 | Herraiz .................. G01R 27/18 324/615 |
| 2013/0147491 A1* | 6/2013 | Kawamura .......... G01R 31/025 324/509 |
| 2013/0300430 A1 | 11/2013 | Lindsay et al. |
| 2015/0204937 A1 | 7/2015 | Lehr et al. |

FOREIGN PATENT DOCUMENTS

| | | |
|---|---|---|
| DE | 10 2006 050 529 A1 | 4/2008 |
| DE | 10 2014 201 044 B3 | 3/2015 |
| EP | 1 146 345 A1 | 10/2001 |
| JP | 2011-250558 A | 12/2011 |

OTHER PUBLICATIONS

German Search Report, Appl. No. 10 2013 226 595.6, dated Mar. 27, 2014, 5 pgs.

* cited by examiner

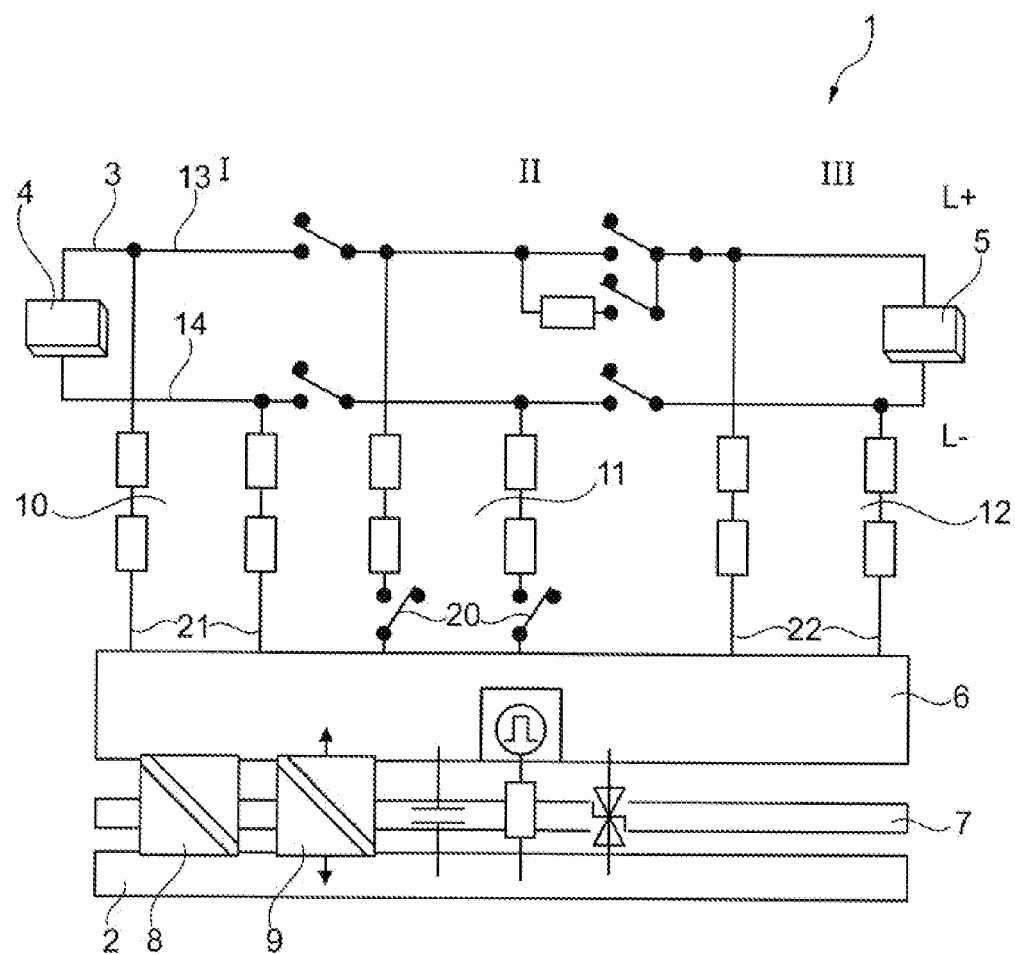

APPARATUS FOR INSULATING MONITORING

CROSS-REFERENCE TO RELATED PATENT APPLICATIONS

This application is based upon and claims the benefit of priority from prior German Patent Application No. 10 2013 226 595.6, filed Dec. 19, 2013, the entire contents of which are incorporated herein by reference in their entirety.

TECHNICAL FIELD

The invention relates to an apparatus for insulation monitoring, in particular for a motor vehicle.

PRIOR ART

Motor vehicles with an electric drive, so-called electric vehicles or else hybrid vehicles, generally have a high-voltage supply system (HV) and a low-voltage supply system (LV). In this context, these two supply systems can be designed with an IT topology, wherein the two supply systems are electrically isolated from one another by insulation apparatuses. This allows for a higher degree of availability and safety for protecting against electric shock in the event of single faults in the electrical insulation. In order to identify and report a single fault of this kind, the two supply systems are monitored to ensure they are sufficiently insulated from one another. This insulation monitoring is performed by means of a passive method or by means of an active method, wherein the insulation monitor is connected by a coupling to HV+ or HV− and additionally is connected to the chassis of the motor vehicle.

In the passive asymmetry method, an asymmetry is identified by means of a differential voltage measurement of the two high-voltage phases L+ and L− with respect to a common measurement point, said asymmetry being caused by an insulation fault. In this case, the imbalance of a measurement bridge is evaluated in order to identify the asymmetry.

The passive 3-voltmeter method ascertains the insulation state by measuring 3 voltage levels in the system. These voltage levels are the system voltage (HV) and also the displacement voltages of the two coupling paths to HV+ and, respectively, HV− which are connected and disconnected in succession in order to artificially unbalance the measurement bridge.

The passive methods usually use an HV voltage of more than 100 V as the auxiliary variable in order to ascertain the insulation fault. The HV system has to be correspondingly switched on or supplied with voltage in order to be able to determine the insulation value. An insulation fault can therefore be ascertained only when an HV system is switched on. In the event of a fault, the faulty system is generally switched off, this making reenabling difficult or preventing reenabling because the insulation value determination process is based on properties of the switched-on system.

A further disadvantage is that the asymmetry method cannot detect a symmetrical insulation fault. This increases the risk of the vehicle catching fire since it may not be possible to identify an insulation fault which is present.

In the active measurement method, a self-generated pulsed measurement voltage which is supplied with respect to the vehicle mass/chassis is superimposed on the HV system. This has the disadvantage of a relatively large amount of expenditure since the measurement voltage has to be self-generated. The advantage is the option of being able to carry out insulation measurement even without an HV voltage being present, that is to say in the deactivated/switched-off system.

In this case, the insulation monitoring methods, that is to say the asymmetrical method and the active method, generally operate with the best level of measurement accuracy in the region of the used internal resistance of the coupling path.

In this case, an HV system generally comprises a plurality of components, such as the charging unit, the energy storage means and an intermediate circuit with a drive train. These components are generally connected to one another by means of so-called main contactors and can be disconnected from one another.

Overall, monitoring of the insulation in the integrated system shows that only one insulation monitor can be used for each HV system component because a plurality of insulation monitors would have a negative influence on one another. Therefore, the insulation monitor has to be installed in a specific section of the HV system. In this case, each of the at least three vehicle sections, such as the charging intermediate circuit, the HV intermediate circuit and the HV battery, is to be considered to be an independent region, provided that the vehicle is not enabled (driving mode or charging process). When only one insulation monitor is used, said insulation monitor can monitor only a specific section and cannot determine whether the further vehicle sections are free of faults or are faulty. This may lead to disadvantages since system sections which are not monitored have to be connected to system sections which are monitored.

Furthermore, identifying the malfunctioning of one of the main contactors is a challenge. If a contactor remains closed even though opening is required, the safety risk increases since system sections which are assumed to be disconnected are unwittingly connected.

Description of the Invention, Problem, Solution, Advantages

The object of the invention is to provide an apparatus for insulation monitoring, in particular of a motor vehicle, which apparatus allows improved insulation monitoring in comparison to the current state of affairs.

The object is achieved by the features of claim 1.

An exemplary embodiment of the invention relates to an apparatus for insulation monitoring between a low-voltage supply system and a high-voltage supply system, wherein the apparatus can be connected both to a high-voltage positive connection and also to a high-voltage negative connection and also to the low-voltage supply system, wherein the apparatus has a plurality of electrical contacts for coupling monitoring connections to the high-voltage circuit by means of a respective high-voltage positive connection and by means of a respective high-voltage negative connection, it being possible for said contacts to be connected to different sections of the high-voltage supply system. As a result, various combinations of the active and of the passive method or of two active or two passive methods can be carried out on account of the plurality of couplings, this improving insulation monitoring.

In this context, it is particularly advantageous when at least a first monitoring connection can be deactivated and at least a second monitoring connection is permanently connected or can be deactivated. As a result, an active or passive method can be deactivatable, while a passive or active method is maintained.

It is also advantageous when active or passive monitoring methods for monitoring the insulation are carried out at a monitoring connection. The quality of the monitoring is improved as a result.

It is also expedient when the sections of the high-voltage supply system can be disconnected from one another by switching apparatuses.

It is further expedient when the monitoring connections have a predefined internal resistance, the magnitude of this internal resistance differing from section to section.

It is further advantageous when the internal resistance of the monitoring connections which cannot be deactivated is greater by at least a factor of 10 than in the monitoring connection which can be deactivated. Mutual influencing during the measurement operation is reduced or avoided as a result.

Further advantageous refinements are described by the following description of the figures and by the dependent claims.

BRIEF DESCRIPTION OF THE DRAWINGS

The invention will be explained in greater detail below on the basis of at least one exemplary embodiment with reference to the drawings, in which:

FIG. 1 shows a schematic view of an apparatus for insulation monitoring.

PREFERRED EMBODIMENT OF THE INVENTION

FIG. 1 shows, in an example according to the invention, an apparatus 1 for insulation monitoring 1, in particular for an electric vehicle. In this case, the vehicle has a low-voltage on-board electrical system 2 of approximately 12/24 V. Furthermore, the vehicle has a high-voltage circuit 3. A battery charging unit 4 and a battery 5 which is to be charged are provided in this high-voltage circuit. The battery charging unit 4 is electrically connected to the battery 5.

The apparatus for insulation monitoring 6 is connected between the high-voltage circuit 3 and the low-voltage supply system 2. In this case, the apparatus for insulation monitoring 6 is separated from the low-voltage supply system by a possibly functional insulation 7, wherein a connection is provided by means of an electrically isolated voltage supply 8 and an electrically isolated communication unit 9. As an alternative, the voltage supply and the communication unit can also be situated in a block without electrical isolation.

In this case, the high-voltage circuit 3 is divided into three sections I, II and III. Monitoring connections 10, 11 and 12 which are in each case connected to the positive connection 13 and to the negative connection 14 of the high-voltage circuit 3 are provided in each section between the apparatus for insulation monitoring 6 and the high-voltage circuit 3.

During operation, a passive method ascertains the insulation state of the overall circuit in section III since the apparatus for insulation monitoring, with the voltage of the battery, has the required auxiliary variable for insulation measurement directly available.

Section II does not have an HV voltage and the auxiliary variable is self-generated by the active method.

In section I, the auxiliary variable for a passive method is provided by the charging unit 4. Since the passive method identifies only asymmetrical faults, symmetrical faults are identified by the active method after the further vehicle sections are interconnected.

In a further advantageous exemplary embodiment of the invention, active measurement is carried out in all of the sections I to III when the sections are disconnected with an open main switch. In this case, a common measurement pulse generator provides the auxiliary variable for measurement, said measurement pulse generator feeding the measurement pulse toward the chassis of the vehicle. The couplings have an internal resistance of similar magnitude and can be disconnected.

Since the measurement is based on a common measurement pulse, the measurement period for the individual sections depends on the measurement period of the section with the highest insulation resistance and the largest supply system discharge capacity. Symmetrical and asymmetrical insulation faults can be identified at any time.

When the sections are interconnected, parallel coupling paths can be disconnected in order to avoid influencing.

If the overall system is interconnected, the insulation monitoring can be realized by means of a single coupling.

In the invention, the apparatus for insulation monitoring has two or more couplings which can be coupled to different items in the system which is to be monitored, for example to the high-voltage circuit of a vehicle.

In this case, a first coupling 20 constitutes a coupling which can be disconnected and has an internal resistance which is appropriate for the application. The level of the internal resistance can lie between 180 kΩ and 2 MΩ in electric and hybrid vehicles.

The further couplings, two 21 to N 22, where N is an integer greater than 2, have an internal resistance which cannot be disconnected and is higher by a factor of 10, in order to avoid mutual influencing during measurement operation when all of the vehicle sections I to III are interconnected. If it is necessary to also design the further couplings with an internal resistance of similar magnitude, it is advantageous when said couplings are likewise designed such that they can be disconnected.

Designing the magnitude of the internal resistance to be similar between the couplings 21 and 22 to the first coupling 20 has the advantage that the measurement methods which are used at the different couplings can operate with the same level of measurement accuracy.

As a result, the combination of the active and passive method can be carried out by these plurality of couplings by means of the apparatus for insulation monitoring.

In general, it is therefore also possible to operate a plurality of active and/or passive methods simultaneously since the common control and evaluation unit with the measurement pulse generator allows synchronization of the measurement results of the individual coupling paths.

Simultaneous monitoring of vehicle sections which are not connected is possible without the entire high-voltage system being activated. It is therefore also not necessary for vehicle sections which are not monitored to be connected to vehicle sections which are monitored, in order to be able to drive or charge the vehicle.

Owing to vehicle sections which are disconnected being monitored, the site of the fault can also be determined when an insulation fault occurs, this considerably simplifying the search for the fault for the servicing personnel.

In addition, the HV voltage of the respective section can also be ascertained by differential voltage measurement with each of the couplings. As a result, the system voltage can be ascertained even with main contactors open in each vehicle section which is connected by means of a coupling. If the main contactors of each section are correctly closed, the same system voltage also has to be able to be measured in each of the sections. If these measured voltages at each coupling path are compared with one another, as in a cross comparison, it is possible to also determine, in addition to the voltage agreement, a deviation between the various measurement points.

A deviation between the voltage measurements of different vehicle sections normally occurs only when the main contactors between the vehicle sections are open.

In the case of a malfunction in the main contactors, such as one of the contactors or the contactors not opening in spite of attempted driving for opening purposes for example, a difference between the results of the voltage measurements would initially be expected. If this difference does not occur, it can be concluded that there is a malfunction in the contactors.

Conversely, a malfunction can occur when the contactors are closed if a main contactor does not close in spite of attempted driving. In this case, identical measurement results would initially be expected in the voltage measurements. However, if the measurement results differ from one another, contrary to expectations, it can likewise be concluded that there is a malfunction in the contactors.

Overall, the implementation of a voltage measurement and insulation measurement by means of the same coupling results in a combined apparatus for measuring the two variables. Implementation by two separate measurement devices is therefore no longer necessary and reduces the costs of the entire vehicle.

The invention claimed is:

1. An apparatus for insulation monitoring between a low-voltage supply system and a high-voltage supply system, wherein the apparatus is connected to a high-voltage positive connection of the high-voltage supply system, to a high-voltage negative connection of the high-voltage supply system, and to the low-voltage supply system, wherein the apparatus comprises a plurality of monitoring connections, wherein each monitoring connection comprises a positive coupling and a negative coupling, wherein each positive coupling is connected to the high-voltage positive connection, wherein each negative coupling is connected to the high-voltage negative connection, wherein the high-voltage system comprises a plurality of high-voltage sections divided from one another by a plurality of switches arranged on the high-voltage positive connection and the high-voltage negative connection, wherein each monitoring connection is connected to a different section of the plurality of high voltage sections of the high-voltage supply system, wherein the apparatus detects faults between the high-voltage supply system and the low-voltage supply system in an insulation arranged between the high-voltage supply system and the low-voltage supply system, wherein the apparatus detects voltage deviations between the plurality of high-voltage sections of the high-voltage system.

2. The apparatus according to claim 1, wherein the plurality of monitoring connections comprises a first monitoring connection and a second monitoring connection, wherein at least the first monitoring connection can be physically disconnected from the high-voltage supply system and at least the second monitoring connection can be physically disconnected from the high-voltage supply system.

3. The apparatus according to claim 1, wherein both an active and a passive monitoring method for monitoring the insulation are carried out by the apparatus.

4. The apparatus according to claim 1, wherein the plurality of high voltage sections of the high-voltage supply system can be disconnected from one another by switching apparatuses.

5. The apparatus according to claim 1, wherein the monitoring connections of the plurality of monitoring connections each have a predefined internal resistance, wherein the magnitude of this internal resistance differs from section to section of the plurality of high voltage sections.

6. The apparatus according to claim 1, wherein the monitoring connections of the plurality of monitoring connections each have a predefined internal resistance, wherein the magnitude of this internal resistance is identical from section to section.

7. The apparatus according to claim 1, wherein the internal resistance of the monitoring connections of the plurality of monitoring connections that cannot be physically deactivated is 10 times larger than in the monitoring connection that can be physically deactivated.

8. The apparatus according to claim 1, wherein a voltage measurement can be carried out on the high-voltage supply system by measuring the voltage of the high-voltage positive connection and also by measuring the voltage of the of the high-voltage negative connection.

9. The apparatus according to claim 1, wherein the plurality of monitoring connections comprises a first monitoring connection and a second monitoring connection, wherein at least the first monitoring connection can be physically deactivated and at least the second monitoring connection can be physically deactivated.

10. The apparatus according to claim 1, wherein the plurality of monitoring connections comprises (i) a first monitoring connection and a second monitoring connection that cannot be physically disconnected from the high-voltage supply system and (ii) a third monitoring connection can be physically disconnected from the high-voltage supply system.

11. The apparatus according to claim 1, wherein a first section of the plurality of high-voltage sections contains a battery charging unit, and wherein a third section of the plurality of high-voltage sections contains a battery.

12. An apparatus for insulation monitoring between a low-voltage supply system and a high-voltage supply system, wherein the apparatus is connected to a high-voltage positive connection of the high-voltage supply system, to a high-voltage negative connection of the high-voltage supply system, and to the low-voltage supply system, wherein the apparatus comprises a plurality of monitoring connections, wherein each monitoring connection comprises a positive coupling and a negative coupling, wherein each positive coupling is connected to the high-voltage positive connection, wherein each negative coupling is connected to the high voltage negative connection, wherein the high-voltage system comprises a plurality of high-voltage sections divided from one another by a plurality of switches arranged on the high-voltage positive connection and the high-voltage negative connection, wherein a first section of the plurality of high-voltage sections contains a battery charging unit, and wherein a third section of the plurality of high-voltage sections contains a battery, wherein each monitoring connection is connected to a different section of the plurality of high-voltage sections of the high-voltage supply system, wherein the apparatus detects faults between the high-voltage supply system and the low-voltage supply system in an insulation arranged between the high-voltage supply system and the low-voltage supply system, wherein the apparatus detects voltage deviations between the plurality of high-voltage sections of the high-voltage system, wherein the plurality of monitoring connections comprises (i) a first monitoring connection and a second monitoring connection that cannot be physically disconnected from the high-voltage supply system and (ii) a third monitoring connection can be physically disconnected from the high-voltage supply system.

\* \* \* \* \*